United States Patent

Martin

(10) Patent No.: US 10,395,923 B2
(45) Date of Patent: Aug. 27, 2019

(54) LOCALIZED ELECTRON BEAM INDUCED DEPOSITION OF SILICON CARBIDE

(71) Applicant: LAWRENCE LIVERMORE NATIONAL SECURITY, LLC, Livermore, CA (US)

(72) Inventor: Aiden Alexander Martin, Walnut Creek, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 157 days.

(21) Appl. No.: 15/729,853

(22) Filed: Oct. 11, 2017

(65) Prior Publication Data

US 2019/0109000 A1   Apr. 11, 2019

(51) Int. Cl.
*H01L 21/02*   (2006.01)
*C23C 14/06*   (2006.01)
*C23C 14/22*   (2006.01)
*H01L 21/67*   (2006.01)

(52) U.S. Cl.
CPC .... *H01L 21/02529* (2013.01); *C23C 14/0635* (2013.01); *C23C 14/221* (2013.01); *H01L 21/67213* (2013.01)

(58) Field of Classification Search
CPC . H01L 21/02529; C23C 16/325; C23C 16/36; C23C 16/4554
See application file for complete search history.

(56) References Cited

U.S. PATENT DOCUMENTS

| | | | | |
|---|---|---|---|---|
| 5,374,318 A * | 12/1994 | Rabalais | ............... | C30B 23/02 428/469 |
| 5,508,368 A * | 4/1996 | Knapp | ............... | C23C 16/0245 347/203 |
| 5,948,232 A * | 9/1999 | Murphy | ............... | C08G 61/124 205/122 |
| 6,153,067 A * | 11/2000 | Maishev | ............... | C23C 14/228 204/298.04 |
| 9,123,506 B2 | 9/2015 | Martin et al. | | |
| 2012/0122302 A1 * | 5/2012 | Weidman | ............... | C23C 16/325 438/478 |
| 2016/0293380 A1 | 10/2016 | Martin et al. | | |

OTHER PUBLICATIONS

Aharonovich et al., "Silicon Carbide Goes Quantum," Nature Physics, Optical Materials, vol. 10, 2014, pp. 93-94.

* cited by examiner

*Primary Examiner* — Caridad Everhart
(74) *Attorney, Agent, or Firm* — Eddie E. Scott

(57) ABSTRACT

A method for produce a silicon-carbide film by admitting a gaseous silicon-carbide precursor into a vacuum chamber containing a substrate and directing an electron beam into the vacuum chamber onto to the surface of the substrate. The electron beam dissociates the gaseous silicon-carbide precursor at the surface of the substrate creating non-volatile fragments that bind to the substrate surface forming a silicon-carbide film.

6 Claims, 3 Drawing Sheets

LOCALIZED ELECTRON BEAM INDUCED DEPOSITION OF SILICON CARBIDE

STATEMENT AS TO RIGHTS TO APPLICATIONS MADE UNDER FEDERALLY SPONSORED RESEARCH AND DEVELOPMENT

The United States Government has rights in this application pursuant to Contract No. DE-AC52-07NA27344 between the United States Department of Energy and Lawrence Livermore National Security, LLC for the operation of Lawrence Livermore National Laboratory.

BACKGROUND

Field of Endeavor

The present application relates to deposition of silicon carbide and more particularly to localized electron beam or ion beam induced deposition of silicon.

Related Application

Related disclosure is included in U.S. patent application Ser. No. 15/729,819 entitled "charged particle induced deposition of boron containing material" filed Oct. 11, 2017. The disclosure of U.S. patent application Ser. No. 15/729,819 filed Oct. 11, 2017 and entitled "charged particle induced deposition of boron containing material" is hereby incorporated herein in its entirety for all purposes by this reference.

State of Technology

This section provides background information related to the present disclosure which is not necessarily prior art.

The article "Silicon carbide goes quantum—Defects in the crystal lattice of silicon carbide prove to be a useful room-temperature source of non-classical light," by Igor Aharonovich and Milos Toth in *NATURE PHYSICS*, Volume 10, February 2014, page 93, provides the state of technology information reproduced below.

"Silicon carbide is a semiconductor that is now widely used in a variety of micro-electromechanical systems, light-emitting diodes and high-power electronics. Its technological appeal stems from the fact that it is amenable to mature, robust nanofabrication methodologies and possesses both a high Young's modulus and excellent thermal conductivity. To many, silicon carbide is a material that offers few surprises. Nevertheless, the increasing need for novel materials for implementing quantum technologies and nanophotonic integrated circuits is forcing scientists to revisit several traditional materials—silicon carbide is one of them."

SUMMARY

Features and advantages of the disclosed apparatus, systems, and methods will become apparent from the following description. Applicant is providing this description, which includes drawings and examples of specific embodiments, to give a broad representation of the apparatus, systems, and methods. Various changes and modifications within the spirit and scope of the application will become apparent to those skilled in the art from this description and by practice of the apparatus, systems, and methods. The scope of the apparatus, systems, and methods is not intended to be limited to the particular forms disclosed and the application covers all modifications, equivalents, and alternatives falling within the spirit and scope of the apparatus, systems, and methods as defined by the claims.

The inventors provide methods for charged particle beam processing using an electron beam or ion beam activated silicon-carbon containing gas to deposit silicon carbide. Silicon-carbon containing precursor gases include methyl silanes. The silicon-carbon containing gas can be mixed with other gases such as alkanes, $CH_4$, and/or $H_2$ to control stoichiometry and material quality. The substrate can be at, below or above room temperature depending on the desired deposition conditions. The deposited film can be heated in vacuum or a $H_2$ environment above room temperature depending on the desired film properties. In one embodiment tetramethylsilane is used as the silicon-carbon precursor gas to produce silicon carbide films by electron beam or ion beam induced deposition at room temperature.

The inventor's apparatus, systems and methods have use in directed deposition of ultra-hard silicon carbide containing material with features down to the nanoscale (General Use), in directed fabrication of single photon emission sources (Optoelectronics), and in directed fabrication of radiation resistant electronic material (Electronics).

The methods are susceptible to modifications and alternative forms. Specific embodiments are shown by way of example. It is to be understood that the apparatus, systems, and methods are not limited to the particular forms disclosed. The apparatus, systems, and methods cover all modifications, equivalents, and alternatives falling within the spirit and scope of the application as defined by the claims.

BRIEF DESCRIPTION OF THE DRAWINGS

The accompanying drawings, which are incorporated into and constitute a part of the specification, illustrate specific embodiments of the apparatus, systems, and methods and, together with the general description given above, and the detailed description of the specific embodiments, serve to explain the principles of the apparatus, systems, and methods.

DETAILED DESCRIPTION OF SPECIFIC EMBODIMENTS

Figure 1:
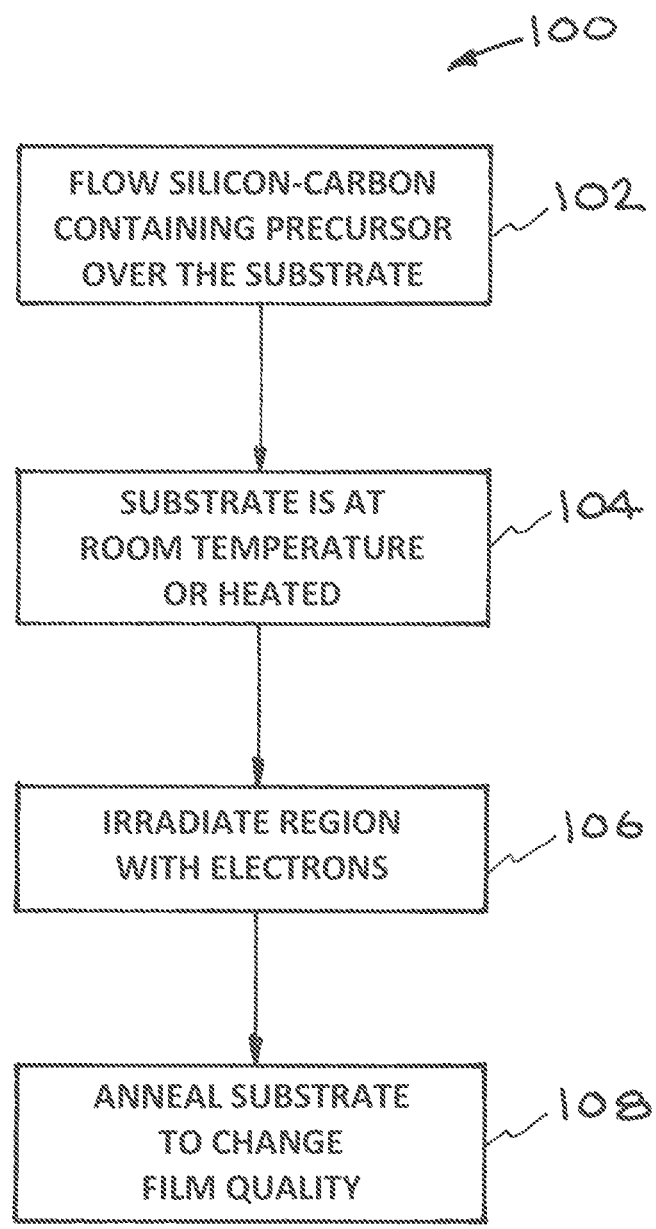
FIG. 1 is a flow chart illustrating one embodiment of the inventor's methods.

Referring to the drawings, to the following detailed description, and to incorporated materials, detailed information about the apparatus, systems, and methods is provided including the description of specific embodiments. The detailed description serves to explain the principles of the apparatus, systems, and methods. The apparatus, systems, and methods are susceptible to modifications and alternative forms. The application is not limited to the particular forms disclosed. The application covers all modifications, equivalents, and alternatives falling within the spirit and scope of the apparatus, systems, and methods as defined by the claims.

The inventor provides the application of electron beam or ion beam induced deposition to a specific type of material (silicon carbide) and the use of an electron microscope to control/localize the deposition of silicon carbide. Gaseous precursor (tetramethylsilane) is delivered to a substrate in a vacuum chamber. Adsorbed molecules are dissociated by a beam of electrons. Non-volatile fragments remain on the substrate leading to formation of a deposit (silicon carbide). The stoichiometry, deposition rate and physical properties of the deposit are all dependent on the precursor gas pressure, mixing gas (if any), electron flux and energy, and substrate temperature.

The vacuum chamber and beam of electrons are provided by a scanning electron microscope system. The scanning electron microscope is capable of providing a focused (~1 nm) beam of electrons which is used to control the deposit feature size. The beam can be scanned over the substrate to pattern features. The stage can be used for patterning larger features across the substrate.

Substrate heating during deposition can be provided by a thermal stage heating accessory or laser induced heating to change the film growth properties and quality. Post-processing the deposits by heating in vacuum or hydrogen can also be used to change the film quality.

Gas delivery is achieved by filling the vacuum chamber with gaseous precursor or using a standard gas delivery nozzle located above the substrate in a high vacuum chamber condition.

Referring now to the drawings, and in particular to FIG. 1, a flow chart illustrates one embodiment of the inventor's methods. This embodiment is designated generally by the reference numeral 100. The flow chart illustrates a number of individual steps that encompass the inventor's methods. The flow chart 100 includes the steps listed below.

Step 102—flow a gaseous silicon-carbide precursor into a vacuum chamber containing a substrate with a substrate surface wherein said gaseous silicon-carbide precursor absorbs to said substrate surface, Step 104—maintain the substrate at room temperature or heat the substrate, Step 106—irradiate a region of the substrate with electrons from an electron beam or ion beam to dissociate the gaseous silicon-carbide precursor creating non-volatile fragments that bind to the substrate surface, and Step 106—anneal the substrate with the non-volatile fragments that bind to the substrate surface.

The embodiment 100 of the inventor's methods for method of producing a silicon-carbide film provides and electron beam or ion beam induced deposition (EBID) process wherein a gaseous silicon-carbide precursor is admitted into the vacuum chamber where it adsorbs to the substrate surface. The electron beam or ion beam dissociates adsorbed precursor molecules creating non-volatile fragments that bind to the surface forming a solid. In one embodiment the gaseous silicon-carbide precursor is an alkylsilane. In another embodiment the gaseous silicon-carbide precursor is a tetraorganosilane. In another embodiment the gaseous silicon-carbide precursor is tetramethylsilane. In another embodiment the gaseous silicon-carbide precursor is a mixture of alkane and silane precursors. In one embodiment the non-volatile fragments that bind to the substrate surface form a deposit and the deposit is heated to a temperature greater than 800 degrees Celsius.

Figure 2:
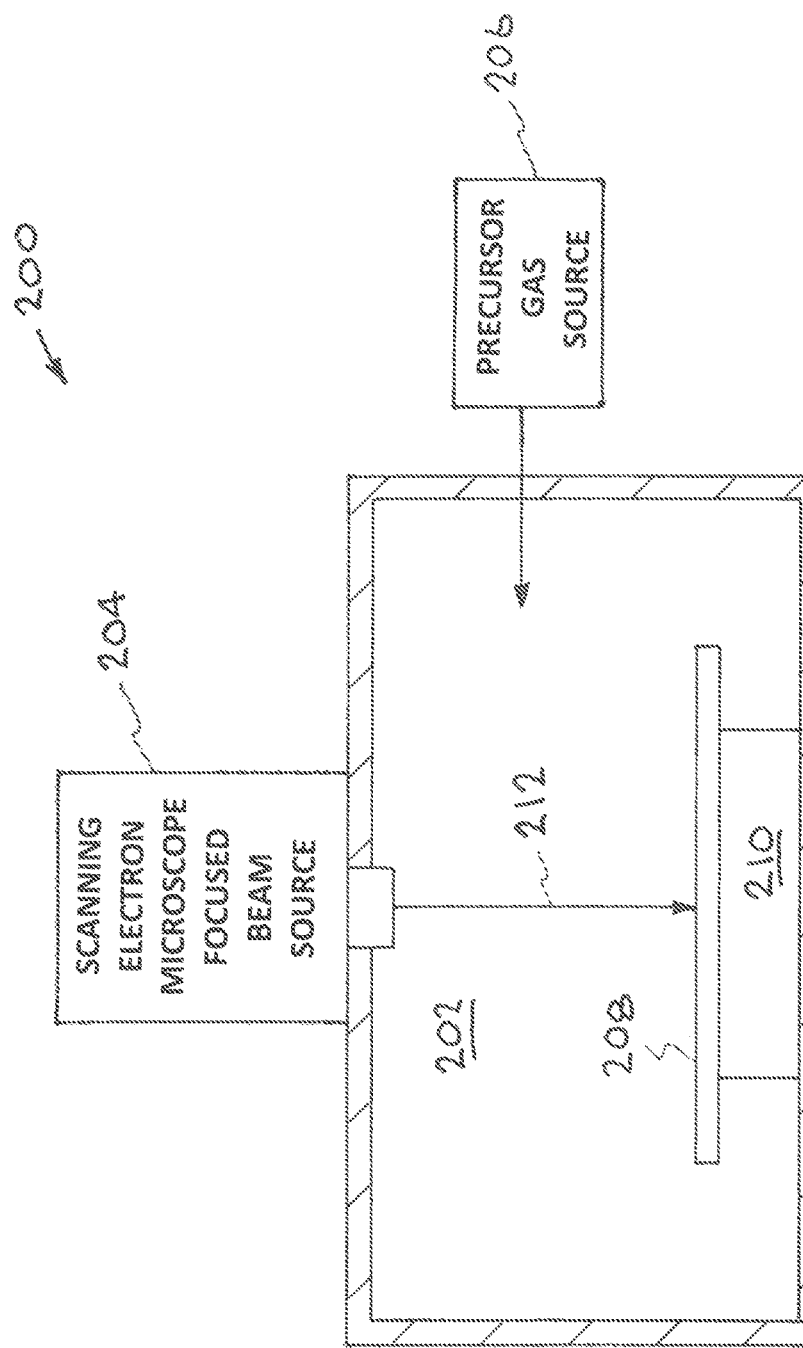
FIG. 2 is a schematic illustration of an electron beam or ion beam induced deposition system according to one embodiment of the invention.

Referring now to FIG. 2, an example embodiment of the inventor's system for producing a silicon-carbide film is illustrated. The system is designated generally by the reference numeral 200. The system 200 illustrated in FIG. 2 includes the components listed below.

Component 102—vacuum chamber,
Component 104—scanning electron microscope focused beam source,
Component 106—precursor gas source,
Component 108—substrate,
Component 110—X-Y stage, and
Component 112—beam.

The system 200 operates by admitting a gaseous silicon-carbide precursor into a vacuum chamber containing a substrate with a substrate surface wherein the gaseous silicon-carbide precursor absorbs to the substrate surface, and directing an electron beam or ion beam to the substrate surface wherein the electron beam or ion beam dissociates the gaseous silicon-carbide precursor creating non-volatile fragments that bind to the substrate surface forming a silicon-carbide film. In one embodiment the gaseous silicon-carbide precursor is an alkylsilane. In another embodiment the gaseous silicon-carbide precursor is a tetraorganosilane. In another embodiment the gaseous silicon-carbide precursor is tetramethylsilane. In another embodiment the gaseous silicon-carbide precursor is a mixture of alkane and silane precursors. In one embodiment the non-volatile fragments that bind to the substrate surface form a deposit and the deposit is heated to a temperature greater than 800 degrees Celsius.

Figure 3:
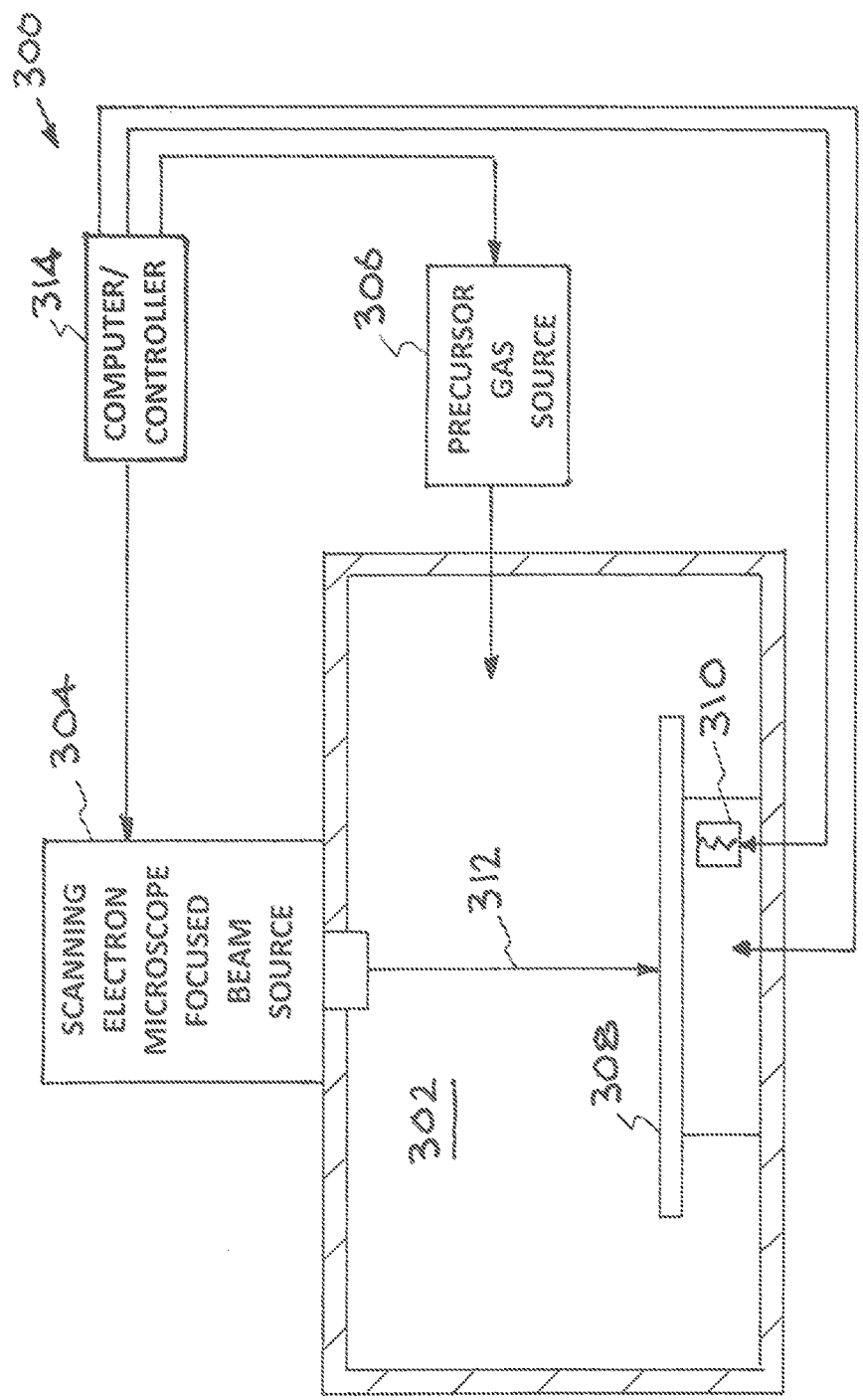
FIG. 3 is a schematic illustration of an electron beam or ion beam induced deposition system according to another embodiment of the invention.

Referring now to FIG. 3; another example embodiment of the inventor's systems for producing a silicon-carbide film is illustrated. This embodiment system is designated generally by the reference numeral 300. The system 300 illustrated in FIG. 3 includes the components listed below.

Component 302—vacuum chamber,
Component 304—scanning electron microscope focused beam source,
Component 306—precursor gas source,
Component 308—substrate,
Component 310—substrate heater,
Component 312—beam,
Component 314—computer/controller, and
Component 316 X-Y stage.

The system 300 utilizes a focused beam source of a scanning electron microscope 304, a vacuum chamber 302, a precursor material source 306, a substrate 308, and heater 310. The system 300 operates by admitting the gaseous silicon-carbide precursor into the vacuum chamber containing the substrate 310 with a substrate surface wherein the gaseous silicon-carbide precursor absorbs to the substrate surface, and directing the electron beam or ion beam 312 to the substrate surface wherein the electron beam or ion beam dissociates the gaseous silicon-carbide precursor creating non-volatile fragments that bind to the substrate surface forming a silicon-carbide film by moving the electron beam or ion beam 312 using x-y stage 316. The computer/controller 314 is used to provide the steps of the inventor's methods. In one embodiment the gaseous silicon-carbide precursor is an alkylsilane. In another embodiment the gaseous silicon-carbide precursor is a tetraorganosilane. In another embodiment the gaseous silicon-carbide precursor is tetramethylsilane. In another embodiment the gaseous silicon-carbide precursor is a mixture of alkane and silane precursors. In one embodiment the non-volatile fragments that bind to the substrate surface form a deposit and the deposit is heated to a temperature greater than 800 degrees Celsius.

Although the description above contains many details and specifics, these should not be construed as limiting the scope of the application but as merely providing illustrations of some of the presently preferred embodiments of the apparatus, systems, and methods. Other implementations, enhancements and variations can be made based on what is described and illustrated in this patent document. The features of the embodiments described herein may be combined in all possible combinations of methods, apparatus, modules, systems, and computer program products. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination. Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described above should not be understood as requiring such separation in all embodiments.

Therefore, it will be appreciated that the scope of the present application fully encompasses other embodiments which may become obvious to those skilled in the art. In the claims, reference to an element in the singular is not intended to mean "one and only one" unless explicitly so stated, but rather "one or more." All structural and functional equivalents to the elements of the above-described preferred embodiment that are known to those of ordinary skill in the art are expressly incorporated herein by reference and are intended to be encompassed by the present claims. Moreover, it is not necessary for a device to address each and every problem sought to be solved by the present apparatus, systems, and methods, for it to be encompassed by the present claims. Furthermore, no element or component in the present disclosure is intended to be dedicated to the public regardless of whether the element or component is explicitly recited in the claims. No claim element herein is to be construed under the provisions of 35 U.S.C. 112, sixth paragraph, unless the element is expressly recited using the phrase "means for."

While the apparatus, systems, and methods may be susceptible to various modifications and alternative forms, specific embodiments have been shown by way of example in the drawings and have been described in detail herein. However, it should be understood that the application is not intended to be limited to the particular forms disclosed. Rather, the application is to cover all modifications, equivalents, and alternatives falling within the spirit and scope of the application as defined by the following appended claims.

The invention claimed is:

1. A method of producing a silicon-carbide film, comprising the steps of:
    admitting a gaseous silicon-carbide precursor into a vacuum chamber containing a substrate with a substrate surface wherein said gaseous silicon-carbide precursor absorbs to said substrate surface, and
    directing an electron beam or ion beam to said substrate surface, wherein said electron beam or ion beam dissociates said gaseous silicon-carbide precursor creating non-volatile fragments that bind to said substrate surface forming a silicon-carbide film, and wherein said step of directing an electron beam or ion beam to said substrate surface comprises using a scanning electron microscope for directing an electron beam or ion beam to said substrate surface.

2. A method of producing a silicon-carbide film, comprising the steps of:
    admitting a gaseous silicon-carbide precursor into a vacuum chamber containing a substrate with a substrate surface wherein said gaseous silicon-carbide precursor absorbs to said substrate surface, and
    directing an electron beam or ion beam to said substrate surface, wherein said electron beam or ion beam dissociates said gaseous silicon-carbide precursor creating non-volatile fragments that bind to said substrate surface forming a silicon-carbide film, and wherein said step of directing an electron beam or ion beam to said substrate surface comprises using an electron flood gun for directing an electron beam or ion beam to said substrate surface.

3. The method of producing a silicon-carbide film, comprising the steps of:
    delivering a gaseous silicon-carbide precursor to a substrate in a vacuum chamber thereby provide an interface of said gaseous silicon-carbide precursor and said substrate in said vacuum chamber,
    directing focused charged particles to said interface of said gaseous silicon-carbide precursor and said substrate, wherein said step of directing focused charged particles to said interface of said gaseous silicon-carbide precursor and said substrate comprises using a scanning electron microscope for directing focused electrons to the said interface of said gaseous silicon-carbide precursor and said substrate, and
    moving said focused charged particles relative to said substrate to produce the silicon-carbide film.

4. A method of producing a silicon-carbide film, comprising the steps of:
    delivering a gaseous silicon-carbide precursor to a substrate in a vacuum chamber thereby provide an interface of said gaseous silicon-carbide precursor and said substrate in said vacuum chamber,
    directing focused charged particles to said interface of said gaseous silicon-carbide precursor and said substrate, wherein said step of directing focused charged particles to said interface of said gaseous silicon-carbide precursor and said substrate comprises using an electron flood gun for directing focused electrons to the said interface of said gaseous silicon-carbide precursor and said substrate, and
    moving said focused charged particles relative to said substrate to produce the silicon-carbide film.

5. A method of producing a silicon-carbide film, comprising the steps of:
    providing a gaseous silicon-carbide precursor;
    providing a vacuum chamber;
    directing a beam of electrons into said vacuum chamber;
    providing a substrate, wherein said substrate has a substrate surface;
    positioning said substrate in said vacuum chamber;
    admitting said gaseous silicon-carbide precursor into said vacuum chamber; and
    directing said beam of electrons in said vacuum chamber onto said gaseous silicon-carbide precursor and onto said substrate surface wherein said gaseous silicon-carbide precursor absorbs to said substrate surface, wherein said electron beam or ion beam dissociates said gaseous silicon-carbide precursor creating non-volatile fragments that bind to said substrate surface forming a silicon-carbide film, wherein said steps of directing a beam of electrons into said vacuum chamber and directing said beam of electrons in said vacuum chamber onto said gaseous silicon-carbide precursor and onto said substrate surface comprises using a scanning electron microscope for directing a beam of electrons into said vacuum chamber, and directing said beam of electrons in said vacuum chamber onto said gaseous silicon-carbide precursor and onto said substrate surface.

6. A method of producing a silicon-carbide film, comprising the steps of:

providing a gaseous silicon-carbide precursor;

providing a vacuum chamber;

directing a beam of electrons into said vacuum chamber;

providing a substrate, wherein said substrate has a substrate surface;

positioning said substrate in said vacuum chamber;

admitting said gaseous silicon-carbide precursor into said vacuum chamber; and directing said beam of electrons in said vacuum chamber onto said gaseous silicon-carbide precursor and onto said substrate surface wherein said gaseous silicon-carbide precursor absorbs to said substrate surface and wherein said electron beam or ion beam dissociates said gaseous silicon-carbide precursor creating non-volatile fragments that bind to said substrate surface forming a silicon-carbide film, wherein said steps of directing a beam of electrons into said vacuum chamber and directing said beam of electrons in said vacuum chamber onto said gaseous silicon-carbide precursor and onto said substrate surface comprises using an electron flood gun for directing a beam of electrons into said vacuum chamber and directing said beam of electrons in said vacuum chamber onto said gaseous silicon-carbide precursor and onto said substrate surface.

* * * * *